US008829411B2

(12) United States Patent
Oshikubo et al.

(10) Patent No.: US 8,829,411 B2
(45) Date of Patent: Sep. 9, 2014

(54) SOLID-STATE IMAGING DEVICE

(71) Applicant: Olympus Medical Systems Corp., Tokyo (JP)

(72) Inventors: Hiromichi Oshikubo, Tokyo (JP); Satoru Adachi, Ibaraki (JP)

(73) Assignee: Olympus Medical Systems Corp., Tokyo (JP)

( * ) Notice: Subject to any disclaimer, the term of this patent is extended or adjusted under 35 U.S.C. 154(b) by 0 days.

(21) Appl. No.: 14/012,487

(22) Filed: Aug. 28, 2013

(65) Prior Publication Data
US 2014/0048690 A1 Feb. 20, 2014

Related U.S. Application Data

(63) Continuation of application No. PCT/JP2013/060088, filed on Apr. 2, 2013.

(30) Foreign Application Priority Data

Apr. 9, 2012 (JP) ................................ 2012-088369

(51) Int. Cl.
*H01L 27/00* (2006.01)
*H01L 27/146* (2006.01)
(52) U.S. Cl.
CPC ............................... *H01L 27/14643* (2013.01)
USPC .............. 250/208.1; 250/214.1; 250/214 SW; 348/298; 348/303
(58) Field of Classification Search
CPC ....... H01L 31/00; H01L 29/765; H01L 25/16; H01L 27/14643; H01L 27/14645; H01L 27/14647; H01L 27/14665; H01L 27/148

USPC ................. 250/214.1, 208.1, 214 R, 214 DC, 250/214 SW; 257/431; 348/294, 298, 302, 348/303, 304, 308, 311
See application file for complete search history.

(56) References Cited

U.S. PATENT DOCUMENTS 6,734,906 B1 5/2004 Hashimoto
8,035,076 B2 * 10/2011 Fukushima ................ 250/214.1

(Continued)

FOREIGN PATENT DOCUMENTS

JP 2000-004399 A 1/2000
JP 2000-78474 A 3/2000
JP 2002-320235 A 10/2002

(Continued)

OTHER PUBLICATIONS

International Search Report dated May 14, 2013 from corresponding International Application No. PCT/JP2013/060088.

*Primary Examiner* — Francis M Legasse, Jr.
(74) *Attorney, Agent, or Firm* — Scully, Scott, Murphy & Presser, P.C.

(57) ABSTRACT

To reduce the number of capacitive elements on a chip to decrease a surface ratio of a peripheral circuit section including capacitive elements to a pixel array section, while maintaining noise resistance of signals high. There is provided a solid-state imaging device including: a plurality of unit pixels; a plurality of transfer lines; and a plurality of switches, wherein each of the unit pixels includes a photoelectric conversion element and a charge voltage conversion element, and outputs respectively a noise voltage generated when the charge voltage conversion element is reset and a signal-noise sum voltage obtained by adding to the noise voltage a signal voltage generated by photoelectric conversion to the other transfer lines that are connected via the switches to the transfer line to which the pixel group including the unit pixel belongs.

6 Claims, 7 Drawing Sheets

(56) References Cited

U.S. PATENT DOCUMENTS

| | | |
|---|---|---|
| 2002/0154347 A1 | 10/2002 | Funakoshi et al. |
| 2003/0137594 A1* | 7/2003 | Koizumi et al. .............. 348/308 |
| 2005/0285958 A1 | 12/2005 | Matsuda |
| 2007/0257281 A1* | 11/2007 | Koizumi et al. .............. 257/225 |
| 2008/0079825 A1 | 4/2008 | Matsuda |
| 2009/0295969 A1 | 12/2009 | Kondo |
| 2010/0155787 A1* | 6/2010 | Koizumi et al. .............. 257/222 |
| 2010/0163711 A1 | 7/2010 | Kondo |

FOREIGN PATENT DOCUMENTS

| | | |
|---|---|---|
| JP | 2006-14107 A | 1/2006 |
| JP | 2006-20037 A | 1/2006 |
| JP | 2008-92014 A | 4/2008 |
| JP | 2009-296121 A | 12/2009 |
| JP | 2010-157803 A | 7/2010 |

* cited by examiner

US 8,829,411 B2

SOLID-STATE IMAGING DEVICE

This application is a Continuation Application of PCT/JP2013/060088 filed on Apr. 2, 2013 which claims priority to Japanese Patent Application No. 2012-088369 filed on Apr. 9, 2012.

TECHNICAL FIELD

The present invention relates to a solid-state imaging device.

BACKGROUND ART

There has conventionally been known, as represented by complementary metal-oxide semiconductor (CMOS) image sensors, an amplification-type solid-state imaging device that converts signal charges, which are accumulated by photoelectric conversion elements, into signal voltages in pixels, and then outputs the signal voltages to signal lines (see, for example, Patent Literature 1). The solid-state imaging device includes two capacitative elements provided for all the vertical signal lines to output from charge voltage conversion elements in the pixels a voltage (hereinafter referred to as noise voltage), which is generated when the charge voltage conversion element in the pixel is reset, and a voltage (hereinafter referred to as signal-noise sum voltage), which is obtained by adding to the noise voltage a signal charge generated by photoelectric conversion, and to thereby retain these voltages in a separate manner.

After the noise voltages and the signal-noise sum voltages from all the pixels of a row selected by a vertical shift register are retained in the capacitative elements, the solid-state imaging device outputs the noise voltages and the signal-noise sum voltages one by one from two capacitative elements included in columns selected by a horizontal shift register.

CITATION LIST

Patent Literature (PTL 1)
Japanese Unexamined Patent Application, Publication No. 2000-004399

SUMMARY OF INVENTION

Technical Problem

However, the solid-state imaging device of Patent Literature 1 includes the capacitative elements, which are twice as many as the vertically signal lines, provided on a CMOS image sensor chip, and thus enlarges a surface ratio of a peripheral circuit section including the capacitative elements to a pixel array.

The present invention has been made in view of the above-stated circumstances, and an object of the present invention is to provide a solid-state imaging device capable of reducing the number of capacitative elements on a chip to decrease the surface ratio of a peripheral circuit section including the capacitative elements to a pixel array section, while maintaining noise resistance of signals high.

Solution to Problem

In order to accomplish the above object, the present invention provides the following solution.

One aspect of the present invention is a solid-state imaging device, including: a plurality of unit pixels arrayed in two dimensions; a plurality of transfer lines to each of which a different pixel group of one or more unit pixels are commonly connected; and a plurality of switches adapted to switch electric connection and disconnection between each of the transfer lines and other two or more transfer lines, wherein each of the unit pixels includes a photoelectric conversion element adapted to photoelectrically convert incident light and a charge voltage conversion element adapted to convert the photoelectrically converted signal charge into a voltage, and outputs respectively a noise voltage generated when the charge voltage conversion element is reset and a signal-noise sum voltage obtained by adding to the noise voltage a signal voltage generated by the photoelectric conversion to the other transfer lines that are connected via the switches to the transfer line to which the pixel group including the unit pixel belongs.

DESCRIPTION OF EMBODIMENTS

First Embodiment

Hereinafter, a solid-state imaging device according to a first embodiment of the present invention is explained with reference to the drawings.

Figure 1:
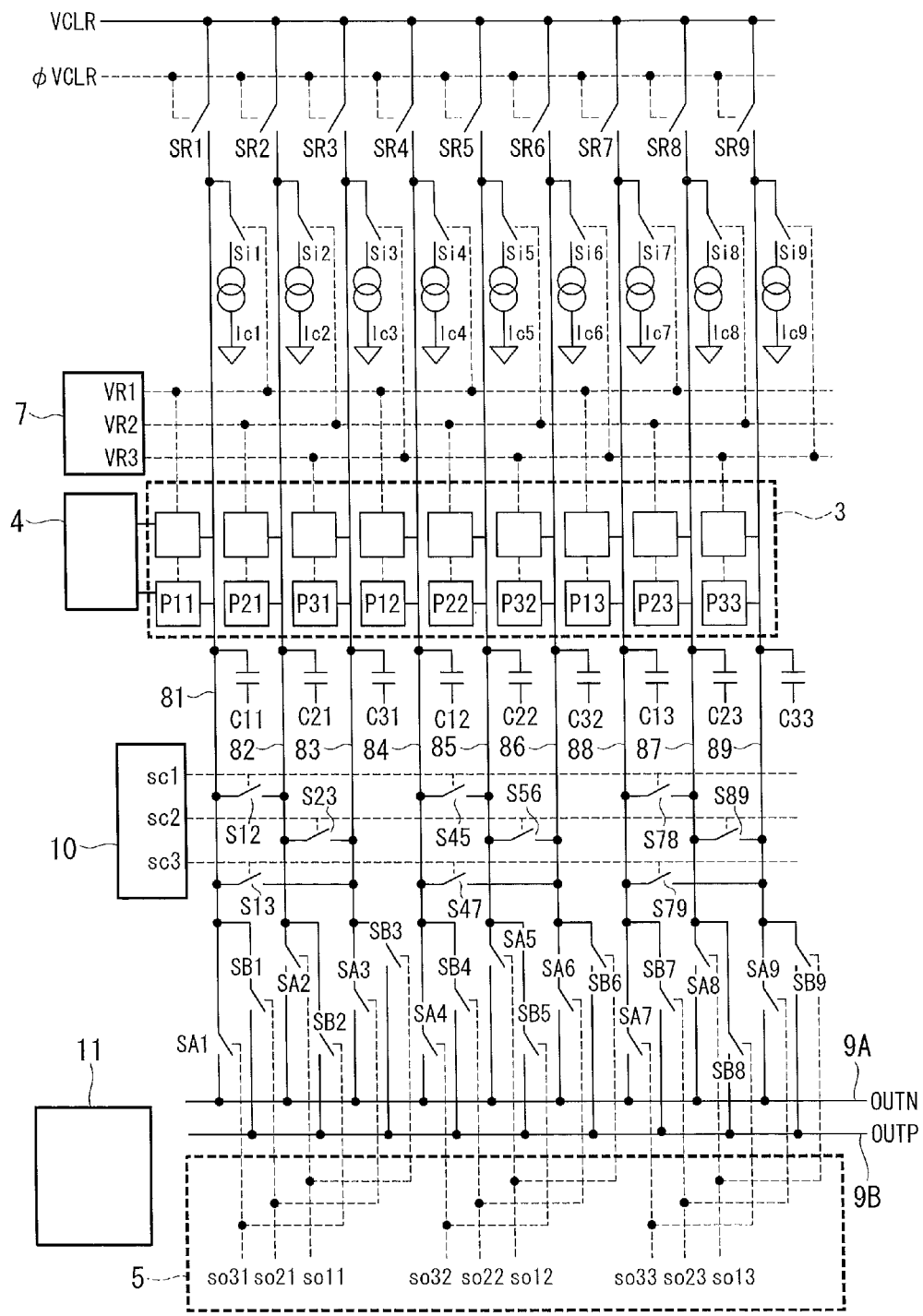
FIG. 1 is a circuit view showing configuration of a solid-state imaging device according to a first embodiment of the present invention.

As shown in FIG. 1, the solid-state imaging device according to the present embodiment includes a pixel array 3 including a plurality of pixels P, a vertical shift register 4, a horizontal shift register 5, a timing generator (supply voltage switching means) 7, a vertical signal line selection circuit 10, and a control circuit (control unit) 11.

The pixel array 3 is adapted to have a plurality of pixels P in a matrix form, i.e., a predetermined number of pixels P arrayed in a row direction and a column direction, in which the pixels P that belong to the same column are each connected to common vertical signal lines 81, 82, 83, 84, 85, 86, 87, 88 and 89. Each of the vertical signal lines 81, 82, 83, 84, 85, 86, 87, 88 and 89 is connected to common horizontal signal lines 9A and 9B via horizontal signal line selection switches SA1 to SB9 (described later), and is connected to constant current sources Ic1 to Ic9 via constant current source connection switches Si1 to Si9 (described later).

The vertical shift register 4 selects one row out of the pixel array 3 and inputs later-described pulses φRj and φTj respectively into the pixels P belonging to the selected row so as to output a signal from the respective pixels P to the vertical signal lines 81, 82, 83, 84, 85, 86, 87, 88 and 89.

The horizontal shift register 5 inputs horizontal signal line selection pulses so11 to so33 into the horizontal signal line selection switches SA1 to SB9 (later described) so as to drive the horizontal signal line selection switches SA1 to SB9 in accordance with a horizontal signal line selection pulse, and to output a signal from the vertical signal lines 81, 82, 83, 84, 85, 86, 87, 88 and 89 to the horizontal signal lines 9A and 9B.

The vertical signal lines 81, 82, 83, 84, 85, 86, 87, 88 and 89 include: the constant current source connection switches Si1 to Si9 adapted to connect between each of the vertical signal lines 81, 82, 83, 84, 85, 86, 87, 88 and 89 and the constant current sources Ic1 to Ic9, and to switch electric connection and disconnection between the vertical signal lines and the constant current sources; the vertical signal line selection switches S12 to S89 adapted to connect between each of the vertical signal lines 81, 82, 83, 84, 85, 86, 87, 88 and 89 and other vertical signal lines 81, 82, 83, 84, 85, 86, 87, 88 and 89, and to switch electric connection and disconnection of the connected vertical signal lines 81, 82, 83, 84, 85, 86, 87, 88 and 89 with each other; and the horizontal signal line selection switches SA1 to SB9 adapted to switch electric connection and disconnection between each of the vertical signal lines 81, 82, 83, 84, 85, 86, 87, 88 and 89 and the horizontal signal lines 9A and 9B. The constant current source connection switches Si1 Si9 and the vertical signal line selection switches S12 to S89 are driven based on vertical signal line selection pulses sc1 to sc3 coming from the later-described vertical signal line selection circuit 10.

The timing generator 7 includes a power source adapted to supply a supply voltage to each of the pixels P and to switch a potential of the supply voltage to each of the pixels P between an enable potential which enables voltage output of the pixel P and a disable potential which stops voltage output of the pixel P. In accordance with voltage pulses VR1 to VR3 based on a control signal from the later-described control circuit 7, the supply voltage is supplied to each of the pixels P, and the constant current source connection switches of the respective vertical signal lines, which are connected to each of the pixels P that received the supply voltage, are turned on.

In the present embodiment, when the voltage pulse VR1 is supplied, voltage output of the pixels P11, P12 and P13 is enabled, when the voltage pulse VR2 is supplied, voltage output of the pixels P21, P22 and P23 is enabled, and when the voltage pulse VR3 is supplied, voltage output of pixels P31, P32 and P33 is enabled.

Note that in order to enable voltage output of the pixels P, a supply voltage of, for example, about 3.3 V, is supplied to the pixels P, whereas in order to stop voltage output of the pixels P, a supply voltage of about 1.0 V, which does not cause a later-described transfer transistor 22 of each of the pixels P to be turned on, is supplied to the pixels P.

The vertical signal line selection circuit 10 outputs the vertical signal line selection pulses sc1 to sc3 to the vertical signal line selection switches S12 to S89, and drives the vertical signal line selection switches S12 to S89.

The control circuit 11 outputs control signals, which cause output of each of the aforementioned pulses in accordance with preset pulse sequences, to the vertical shift register 4, the horizontal shift register 5, the timing generator 7, and the vertical signal line selection circuit 10, by which read operation to read signals from the pixel array 3 is controlled.

Figure 2:
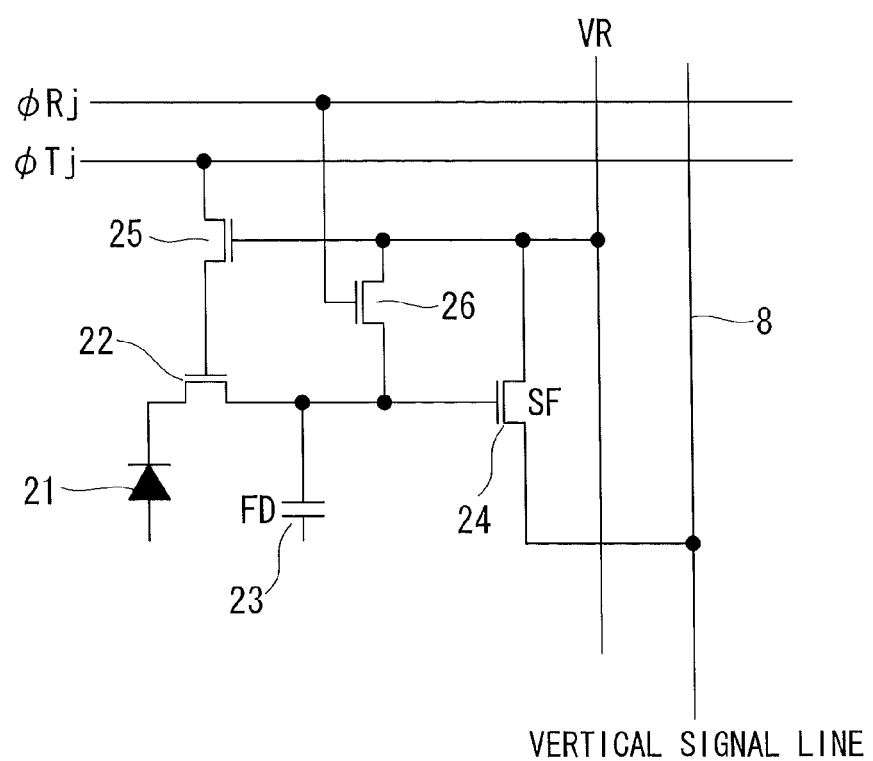
FIG. 2 is a circuit diagram showing configuration of a pixel included in the solid-state imaging device of FIG. 1.

A description is now given of circuitry of each of the pixels P with reference to FIG. 2.

The pixel P includes a photodiode (PD, photoelectric conversion element) 21 adapted to photoelectrically convert a received light signal and accumulates the signal charge, a transfer transistor 22 adapted to transfer the signal charge accumulated in the PD 21, a floating diffusion (FD, charge voltage conversion element) 23 adapted to convert the signal charge transferred by the transfer transistor 22 into a voltage, an amplification transistor 24 adapted to read the signal charge accumulated in the FD 23 as a voltage, a pixel selecting transistor 25 connected in between the φTj and the transfer transistor 22, and an FD reset transistor 26 adapted to reset the voltage of the FD 23.

The amplification transistor 24 amplifies a signal voltage of the FD 23 that is connected to a gate, and outputs the signal to the vertical signal line 8 on the source side. More specifically, when VR voltage of an arbitrary column is 3.3 V and an FD reset pulse φRj is inputted from the vertical shift register 4 into the gate of the FD reset transistor 26, the gate of the amplification transistor 24 is activated, and read pixel selection is performed. At the same time, the signal charge transferred to the FD 23 is discharged to the drain side of the FD reset transistor 26. As a consequence, the voltage of the FD 23 is reset.

When the transfer pulse φTj is inputted into the gate of the transfer transistor 22 via the pixel selecting transistor 25, the transfer transistor 22 transfers the signal charge, which has been accumulated in the PD 21, from the PD 21 on the source side to the FD 23 on the drain side. The φTj signal to the transfer transistor 22 is selected for each column by the selecting transistor 25 being put in an electrically connected state or disconnected state according to the VR voltage. The transfer operation resets the amount of signal charge accumulated in the PD 21 to zero. The FD 23 generates a signal voltage corresponding to the signal charge transferred from the PD 21 via the transfer transistor 22.

Figure 3:
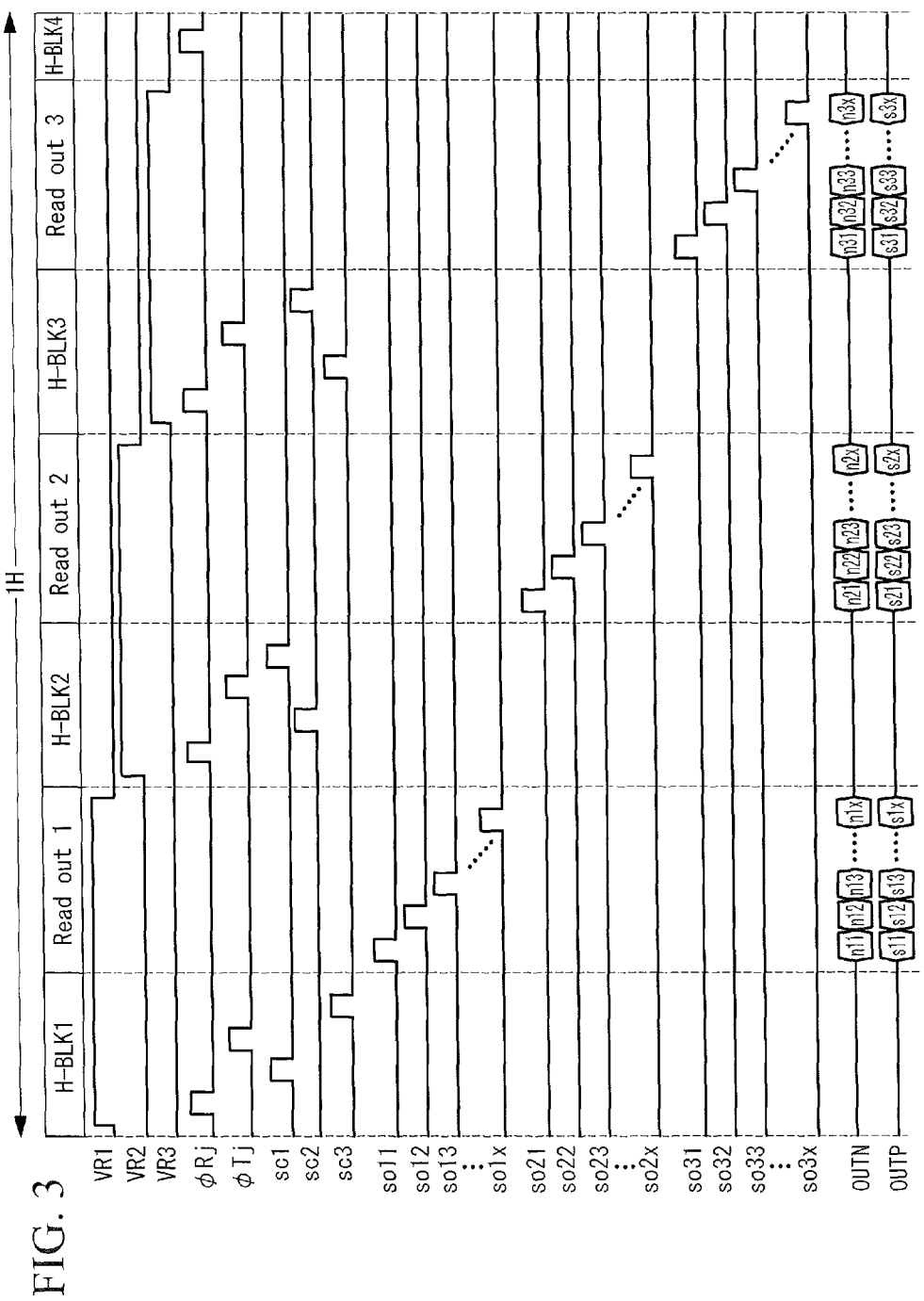
FIG. 3 is a timing chart showing operation of the solid-state imaging device of FIG. 1.

Next, a method for driving the thus-configured solid-state imaging device is described with reference to the timing chart of FIG. 3.

The solid-state imaging device according to the present embodiment reads a voltage relating to a light signal received by the pixel P and a voltage (hereinafter referred to as "noise voltage") relating to noise generated at the time of resetting the FD 23. Here, the voltage relating to the light signal received by the pixel P includes the voltage relating to noise generated at the time of resetting the above-stated FD 23. Therefore, in the solid-state imaging device according to the present embodiment, the noise voltage and a voltage (hereinafter referred to as "signal-noise sum voltage") obtained by adding to the noise voltage the voltage relating to the light signal received by the pixel P are read out.

Readout of the noise voltage and the signal-noise sum voltage is generally divided into two operations: one operation to output the noise voltage and the signal-noise sum voltage respectively to any one of the vertical signal lines and to temporarily retain the charges thereof in parasitic capacitances of the vertical signal lines; and the other operation to read the retained charges.

First, the operation to output the noise voltage and the signal-noise sum voltage to a vertical signal line and to temporarily retain the charges thereof in the parasitic capacitance of the vertical signal line is performed as shown below.

Note that in an initial state, a vertical signal line reset pulse φVCLR is applied, and the potential of the vertical signal lines 81, 82, 83, 84, 85, 86, 87, 88 and 89 are reset to a VCLR potential.

In this state, a VR1 voltage is applied from the timing generator 7, and the constant current source connection switches Si1, Si4 and Si7 of output target columns are turned on, so that pixels P11, P12 and P13 are selected out of the respective pixels P that belong to an output target row. Next, upon application of an FD reset pulse TR1 from the vertical shift register 4 to the respective pixels P that belong to the output target row, the potentials of the FDs 23 are reset and electricity flows through the amplification transistors 24 of the selected pixels P11, P12 and P13.

Then, source potentials of the amplification transistors 24 of the selected pixels P11, P12 and P13 are respectively outputted to the vertical signal line capacitances 81, 84 and 87, and upon application of a vertical signal line selection pulse sc1 from the vertical signal line selection circuit 10, the vertical signal line selection switches S12, S45 and S78 are turned on. As a consequence, among the respective pixels P that belong to the output target row, the pixel P11 is electrically connected to the vertical signal line 82, the pixel P12 is electrically connected to the vertical signal line 85, and the pixel P13 is electrically connected to the vertical signal line 88, so that the noise voltages generated at the time of resetting the FDs 23 and the like are outputted to the vertical signal lines 82, 85 and 88 and are retained therein.

Next, a charge transfer pulse $\phi T$ is applied to the row selected by the vertical shift register 4, by which signal charges accumulated in the PDs 21 are transferred to the FDs 23. Then, upon application of a vertical signal line selection pulse sc3 from the vertical signal line selection circuit 10, the vertical signal line selection switches S13, S47 and S79 are turned on. As a consequence, among the respective pixels P that belong to the output target row, the pixel P11 is electrically connected to the vertical signal line 83, the pixel P12 is electrically connected to the vertical signal line 86, and the pixel P13 is electrically connected to the vertical signal line 89. The signal-noise sum voltages in the FDs 23 of the pixels P11, P12 and P13 in the first row are outputted to the vertical signal lines 83, 86 and 89, which are in a floating potential state, via the amplification transistors 24, and are retained therein.

The operation to read the noise voltage and the signal-noise sum voltage from each of the vertical signal lines 82, 85 and 88 that retain the noise voltages and the vertical signal lines 83, 86 and 89 that retain the signal-noise sum voltages is performed as shown below.

A horizontal signal line selection pulse so11 is applied from the horizontal shift register 5 to the horizontal signal line selection switches SA2 and SB3. As a consequence, the vertical signal line 82 is electrically connected to the horizontal signal line 9A, and the vertical signal line 83 is electrically connected to the horizontal signal line 9B. Then, the noise voltage of the pixel P11 is read via the horizontal signal line 9A, and the signal-noise sum voltage of the pixel P11 is read via the horizontal signal line 9B.

Similarly, a horizontal signal line selection pulse so12 is applied from the horizontal shift register 5 to the horizontal signal line selection switches SA5 and SB6. As a consequence, the vertical signal line 85 is electrically connected to the horizontal signal line 9A, and the vertical signal line 85 is electrically connected to the horizontal signal line 9B. Thus, the noise voltage of the pixel P12 is read via the horizontal signal line 9A, and the signal-noise sum voltage of the pixel P12 is read via the horizontal signal line 9B.

Similarly, a horizontal signal line selection pulse so13 is applied from the horizontal shift register 5 to the horizontal signal line selection switches SA8 and SB9. As a consequence, the vertical signal line 88 is electrically connected to the horizontal signal line 9A, and the vertical signal line 88 is electrically connected to the horizontal signal line 9B. Thus, the noise voltage of the pixel P13 is read via the horizontal signal line 9A, and the signal-noise sum voltage of the pixel P13 is read via the horizontal signal line 9B.

Next, a VR2 voltage is applied from the timing generator 7, and the constant current source connection switches Sit, Si5 and Si8 of output target columns are turned on, so that pixels P21, P22 and P23 are selected from the respective pixels P that belongs to the output target rows. Next, upon application of an FD reset pulse $\phi R2$ from the vertical shift register 4 to the respective pixels P that belong to the output target rows, the potentials of the FDs 23 are reset and the amplification transistors 24 of the selected pixels P21, P22 and P23 are asserted.

Then, source potentials of the amplification transistors 24 of the selected pixels P21, P22 and P23 are respectively outputted to the vertical signal line capacitances 82, 85 and 88, and upon application of a vertical signal line selection pulse sc2 from the vertical signal line selection circuit 10, the vertical signal line selection switches S23, S56 and S89 are turned on. As a consequence, among the respective pixels P that belong to the output target rows, the pixel P21 is electrically connected to the vertical signal line 83, the pixel P22 is electrically connected to the vertical signal line 86, and the pixel P23 is electrically connected to the vertical signal line 89, so that the noise voltages generated at the time of resetting the FDs 23 and the like are outputted to the vertical signal lines 83, 86 and 89 and are retained therein.

Next, a charge transfer pulse $\phi T$ is applied to the row selected by the vertical shift register 4, by which signal charges accumulated in the PDs 21 are transferred to the FDs 23. Then, upon application of a vertical signal line selection pulse sc1 from the vertical signal line selection circuit 10, the vertical signal line selection switches S12, S45 and S78 are turned on. As a consequence, among the respective pixels P that belong to the output target rows, the pixel P21 is electrically connected to the vertical signal line 81, the pixel P22 is electrically connected to the vertical signal line 84, and the pixel P23 is electrically connected to the vertical signal line 87. The signal-noise sum voltages in the FDs 23 of the pixels P21, P22 and P23 in the first row are outputted to the vertical signal lines 81, 84 and 87, which are in a floating potential state, via the amplification transistors 24, and are retained therein.

Then, the operation to read the noise voltage and the signal-noise sum voltage from each of the vertical signal lines 83, 86 and 89 that retain the noise voltages and the vertical signal lines 81, 84 and 87 that retain the signal-noise sum voltages is performed as shown below.

A horizontal signal line selection pulse so21 is applied from the horizontal shift register 5 to the horizontal signal line selection switches SA3 and SB1. As a consequence, the vertical signal line 83 is electrically connected to the horizontal signal line 9A, and the vertical signal line 81 is electrically connected to the horizontal signal line 9B. Thus, the noise voltage of the pixel P21 is read via the horizontal signal line 9A, and the signal-noise sum voltage of the pixel P21 is read via the horizontal signal line 9B.

Similarly, a horizontal signal line selection pulse so22 is applied from the horizontal shift register 5 to the horizontal signal line selection switches SA6 and SB4. As a consequence, the vertical signal line 86 is electrically connected to the horizontal signal line 9A, and the vertical signal line 84 is electrically connected to the horizontal signal line 9B. Thus, the noise voltage of the pixel P22 is read via the horizontal signal line 9A, and the signal-noise sum voltage of the pixel P22 is read via the horizontal signal line 9B.

Similarly, a horizontal signal line selection pulse so23 is applied from the horizontal shift register 5 to the horizontal signal line selection switches SA9 and SB7. As a consequence, the vertical signal line 89 is electrically connected to the horizontal signal line 9A, and the vertical signal line 87 is electrically connected to the horizontal signal line 9B. Thus, the noise voltage of the pixel P23 is read via the horizontal signal line 9A, and the signal-noise sum voltage of the pixel P23 is read via the horizontal signal line 9B.

Next, a VR3 voltage is applied from the timing generator 7, and the constant current source connection switches Si3, Si6 and Si9 of output target columns are turned on, so that pixels P31, P32 and P33 are selected from the respective pixels P that belong to the output target rows. Next, upon application of an FD reset pulse φR3 from the vertical shift register 4 to the respective pixels P that belong to the output target rows, the potentials of the FDs 23 are reset and the amplification transistors 24 of the selected pixels P31, P32 and P33 are asserted.

Then, source potentials of the amplification transistors 24 of the selected pixels P31, P32 and P33 are respectively outputted to the vertical signal line capacitances 83, 86 and 89, and upon application of a vertical signal line selection pulse sc3 from the vertical signal line selection circuit 10, the vertical signal line selection switches S13, S47 and S79 are turned on. As a consequence, among the respective pixels P that belong to the output target rows, the pixel P31 is electrically connected to the vertical signal line 81, the pixel P32 is electrically connected to the vertical signal line 84, and the pixel P33 is electrically connected to the vertical signal line 87, so that the noise voltages generated at the time of resetting the FDs 23 and the like are outputted to the vertical signal lines 81, 84 and 87, and are retained therein.

Next, a charge transfer pulse φT is applied to the row selected by the vertical shift register 4, by which signal charges accumulated in the PDs 21 are transferred to the FDs 23. Then, upon application of a vertical signal line selection pulse sc2 from the vertical signal line selection circuit 10, the vertical signal line selection switches S23, S56 and S89 are turned on. As a consequence, among the respective pixels P that belong to the output target rows, the pixel P31 is electrically connected to the vertical signal line 82, the pixel P32 is electrically connected to the vertical signal line 86, and the pixel P33 is electrically connected to the vertical signal line 89. The signal-noise sum voltages in the FDs 23 of the pixels P31, P32 and P33 in the first row are outputted to the vertical signal lines 83, 86 and 89, which are in a floating potential state, via the amplification transistors 24, and are retained therein.

Then, the operation to read the noise voltage and the signal-noise sum voltage from each of the vertical signal lines 81, 84 and 87 that retain the noise voltages and the vertical signal lines 83, 86 and 89 that retain the signal-noise sum voltages is performed as shown below.

A horizontal signal line selection pulse so31 is applied from the horizontal shift register 5 to the horizontal signal line selection switches SA1 and SB1. As a consequence, the vertical signal line 81 is electrically connected to the horizontal signal line 9A, and the vertical signal line 83 is electrically connected to the horizontal signal line 9B. Thus, the noise voltage of the pixel P31 is read via the horizontal signal line 9A, and the signal-noise sum voltage of the pixel P31 is read via the horizontal signal line 9B.

Similarly, a horizontal signal line selection pulse so32 is applied from the horizontal shift register 5 to the horizontal signal line selection switches SA4 and SB5. As a consequence, the vertical signal line 84 is electrically connected to the horizontal signal line 9A, and the vertical signal line 86 is electrically connected to the horizontal signal line 9B. Thus, the noise voltage of the pixel P32 is read via the horizontal signal line 9A, and the signal-noise sum voltage of the pixel P32 is read via the horizontal signal line 9B.

Similarly, a horizontal signal line selection pulse so33 is applied from the horizontal shift register 5 to the horizontal signal line selection switches SA7 and SB8. As a consequence, the vertical signal line 87 is electrically connected to the horizontal signal line 9A, and the vertical signal line 89 is electrically connected to the horizontal signal line 9B. Thus, the noise voltage of the pixel P33 is read via the horizontal signal line 9A, and the signal-noise sum voltage of the pixel P33 is read via the horizontal signal line 9B.

In this way, the noise voltage and the signal-noise sum voltage are outputted and read from every third pixels in all the pixels P that belong to the output target row. In the end, the noise voltage and the signal-noise sum voltage of all the pixels P that belong to the output target row are outputted and read out.

As described in the foregoing, according to the present embodiment, a noise voltage generated by resetting the output terminal of the PD of a pixel P that is one unit pixel is outputted to another vertical signal line, which is connected via a vertical signal line selection switch to the vertical signal line that is connected to the pixel P, when the vertical signal line selection switch is electrically connected. In contrast, a signal-noise sum voltage outputted from the pixel P is outputted to a vertical signal line, which is connected via another vertical signal line selection switch to the vertical signal line that is connected to the pixel P, and which is different from the vertical signal line to which the noise voltage is outputted, when the another vertical signal line selection switch is electrically connected.

More specifically, a signal voltage can easily be acquired by subtracting the noise voltage, which is outputted to one vertical signal line, from the signal-noise sum voltage which is outputted to another vertical signal line. In this case, only one capacitative component is required for each vertical signal line. Therefore, as shown in the present embodiment, it becomes possible to implement a configuration in which the noise voltage or the signal-noise sum voltage is retained in the parasitic capacitance of each vertical signal line so that additional provision of capacitative components is avoided. In addition, the signal voltage can easily be acquired simply by providing one capacitative element to each vertical signal line.

As a result, it becomes possible to acquire a signal with high noise resistance by subtracting the noise voltage from the signal-noise sum voltage, as well as to reduce the number of capacitative elements on a chip to decrease a surface ratio of a peripheral circuit section including a capacitative element section to a pixel array section.

Note that in FIG. 1, reference characters C11 to C33 schematically designate capacitative components provided in the respective vertical signal lines.

Second Embodiment

Hereinafter, a solid-state imaging device according to a second embodiment of the present invention is described with reference to the drawings.

In the present embodiment, component members identical to those in the above-stated first embodiment are designated by the identical reference numerals to omit the description thereof.

Figure 4:
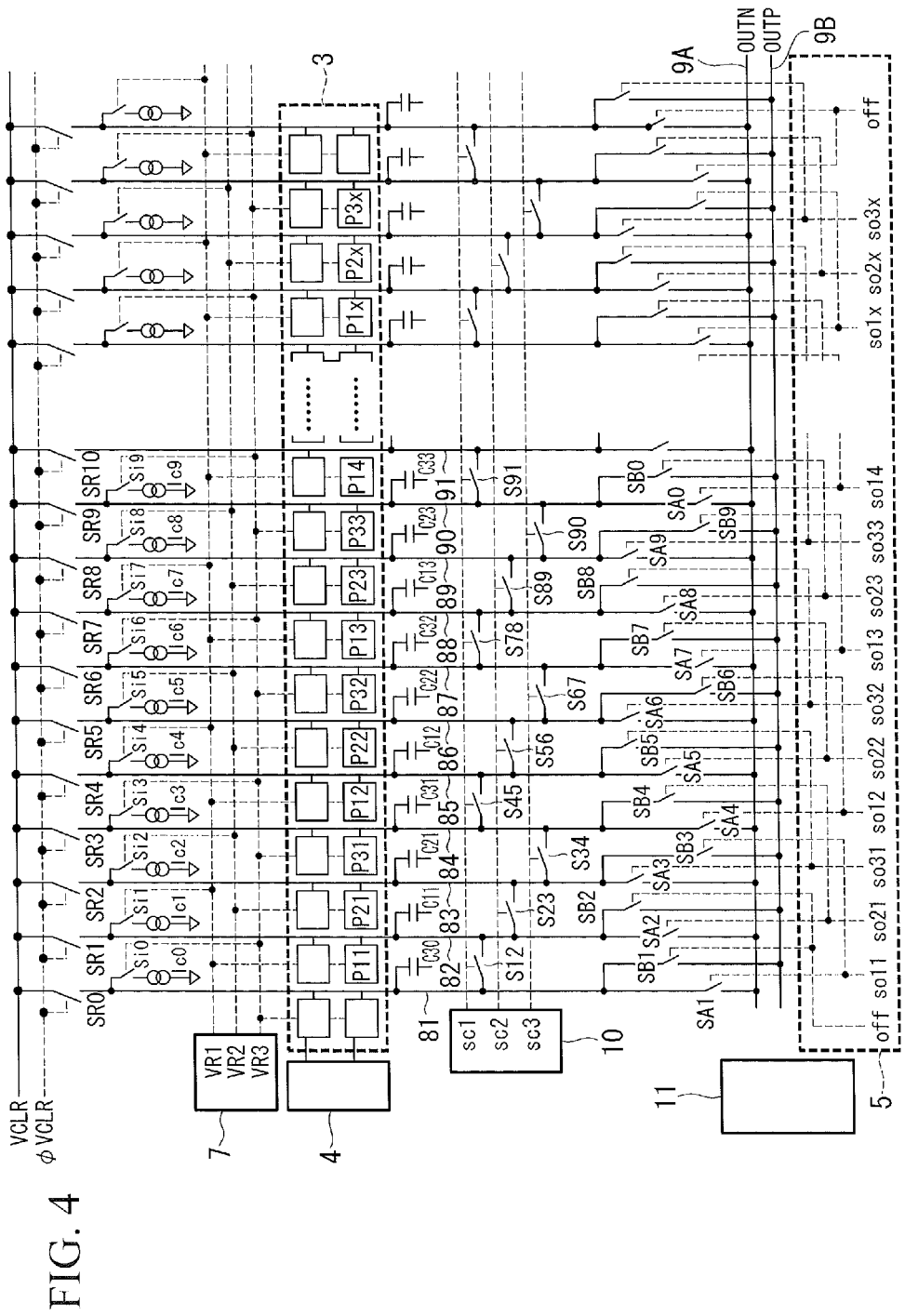
FIG. 4 is a circuit view showing configuration of a solid-state imaging device according to a second embodiment of the present invention.

As shown in FIG. 4, among a plurality of pixels P arrayed in a matrix formed on the pixel array 3, the pixels P belonging to the same column are each connected to common vertical signal lines 81, 82, 83, 84, 85, 86, 87, 88, 89, 90 and 91, and the respective vertical signal lines 81, 82, 83, 84, 85, 86, 87, 88, 89, 90 and 91 are each provided with vertical signal line selection switches S12 to S91 adapted to switch electrical connection and disconnection with adjacent vertical signal lines on both sides.

Further, the respective vertical signal lines 81, 82, 83, 84, 85, 86, 87, 88, 89, 90 and 91 are connected to horizontal signal lines 9A and 9B via horizontal signal line selection switches SA1 to SB0.

Figure 5:
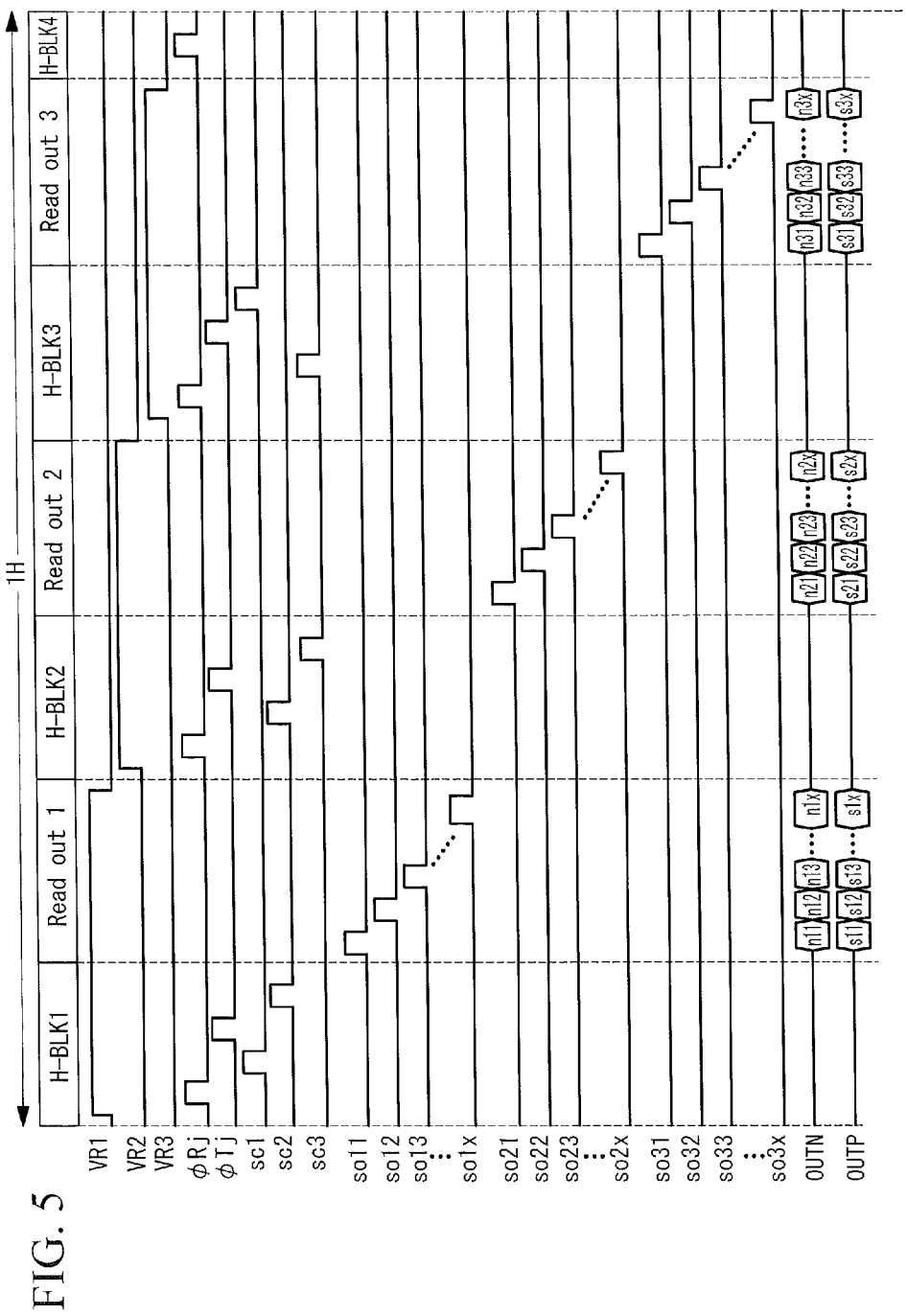
FIG. 5 is a timing chart showing operation of the solid-state imaging device of FIG. 4.

Next, a method for driving the thus-configured solid-state imaging device is described with reference to the timing chart of FIG. 5.

The operation to output the noise voltage and the signal-noise sum voltage to vertical signal lines and to temporarily retain the charges thereof in parasitic capacitances of the vertical signal lines in the solid-state imaging device according to the present embodiment is performed as shown below.

Note that in the initial state, a vertical signal line reset pulse φVCLR is applied, and the potential of the vertical signal lines 81, 82, 83, 84, 85, 86, 87, 88, 89, 90 and 91 are reset to a VCLR potential.

In this state, a VR1 voltage is applied from the timing generator 7, and the constant current source connection switches Si1, Si4 and Si7 of output target columns are turned on, so that pixels P11, P12 and P13 are selected from the respective pixels P that belong to the output target rows. Next, upon application of an FD reset pulse TR1 from the vertical shift register 4 to the respective pixels P that belong to the output target rows, the potentials of the FDs 23 are reset and the amplification transistors 24 of the selected pixels P11, P12 and P13 are asserted.

Then, source potentials of the amplification transistors 24 of the selected pixels P11, P12 and P13 are respectively outputted to the vertical signal line capacitances 82, 85 and 88, and upon application of a vertical signal line selection pulse sc1 from the vertical signal line selection circuit 10, the vertical signal line selection switches S12, S45 and S78 are turned on. As a consequence, among the respective pixels P that belong to the output target rows, the pixel P11 is electrically connected to the vertical signal line 81, the pixel P12 is electrically connected to the vertical signal line 84, and the pixel P13 is electrically connected to the vertical signal line 87, so that the noise voltages generated at the time of resetting the FDs 23 and the like are outputted to the vertical signal lines 81, 84 and 87, and are retained therein.

Next, a charge transfer pulse φT is applied to the row selected by the vertical shift register 4, by which signal charges accumulated in the PDs 21 are transferred to the FDs 23. Then, upon application of a vertical signal line selection pulse sc2 from the vertical signal line selection circuit 10, the vertical signal line selection switches S23, S56 and S89 are turned on. As a consequence, among the respective pixels P that belong to the output target rows, the pixel P11 is electrically connected to the vertical signal line 83, the pixel P12 is electrically connected to the vertical signal line 86, and the pixel P13 is electrically connected to the vertical signal line 89. The signal-noise sum voltages in the FDs 23 of the pixels P11, P12 and P13 in the first row are outputted to the vertical signal lines 83, 86 and 89, which are in a floating potential state, via the amplification transistors 24, and are retained therein.

Then, the operation to read the noise voltage and the signal-noise sum voltage from each of the vertical signal lines 81, 84 and 87 that retain the noise voltages and the vertical signal lines 83, 86 and 89 that retain the signal-noise sum voltages is performed as shown below.

A horizontal signal line selection pulse so11 is applied from the horizontal shift register 5 to the horizontal signal line selection switches SA1 and SB3. As a consequence, the vertical signal line 81 is electrically connected to the horizontal signal line 9A, and the vertical signal line 83 is electrically connected to the horizontal signal line 9B. Then, the noise voltage of the pixel P11 is read via the horizontal signal line 9A, and the signal-noise sum voltage of the pixel P11 is read via the horizontal signal line 9B.

Similarly, a horizontal signal line selection pulse so12 is applied from the horizontal shift register 5 to the horizontal signal line selection switches SA4 and SB6. As a consequence, the vertical signal line 84 is electrically connected to the horizontal signal line 9A, and the vertical signal line 86 is electrically connected to the horizontal signal line 9B. Thus, the noise voltage of the pixel P12 is read via the horizontal signal line 9A, and the signal-noise sum voltage of the pixel P12 is read via the horizontal signal line 9B.

Similarly, a horizontal signal line selection pulse so13 is applied from the horizontal shift register 5 to the horizontal signal line selection switches SA7 and SB9. As a consequence, the vertical signal line 87 is electrically connected to the horizontal signal line 9A, and the vertical signal line 89 is electrically connected to the horizontal signal line 9B. Thus, the noise voltage of the pixel P13 is read via the horizontal signal line 9A, and the signal-noise sum voltage of the pixel P13 is read via the horizontal signal line 9B.

Next, a VR2 voltage is applied from the timing generator 7, and the constant current source connection switches Si2, Si5 and Si8 of output target columns are turned on, so that pixels P21, P22 and P23 are selected from the respective pixels P that belong to the output target rows. Next, upon application of an FD reset pulse φR2 from the vertical shift register 4 to the respective pixels P that belong to the output target rows, the potentials of the FDs 23 are reset and the amplification transistors 24 of the selected pixels P21, P22 and P23 are asserted.

Then, source potentials of the amplification transistors 24 of the selected pixels P21, P22 and P23 are respectively outputted to the vertical signal line capacitances 83, 86 and 89, and upon application of a vertical signal line selection pulse sc2 from the vertical signal line selection circuit 10, the vertical signal line selection switches S23, S56 and S89 are turned on. As a consequence, among the respective pixels P that belong to the output target rows, the pixel P21 is electrically connected to the vertical signal line 82, the pixel P22 is electrically connected to the vertical signal line 85, and the pixel P23 is electrically connected to the vertical signal line 88, so that the noise voltages generated at the time of resetting the FDs 23 and the like are outputted to the vertical signal lines 82, 85 and 88 and are retained therein.

Next, a charge transfer pulse φT is applied to the row selected by the vertical shift register 4, by which signal charges accumulated in the PDs 21 are transferred to the FDs 23. Then, upon application of a vertical signal line selection pulse sc3 from the vertical signal line selection circuit 10, the vertical signal line selection switches S34, S67 and S90 are turned on. As a consequence, among the respective pixels P that belong to the output target rows, the pixel P21 is electrically connected to the vertical signal line 84, the pixel P22 is electrically connected to the vertical signal line 87, and the pixel P23 is electrically connected to the vertical signal line 90. The signal-noise sum voltages in the FDs 23 of the pixels P21, P22 and P23 in the first row are outputted to the vertical signal lines 84, 87 and 90, which are in a floating potential state, via the amplification transistors 24, and are retained therein.

The operation to read the noise voltage and the signal-noise sum voltage from each of the vertical signal lines 82, 85 and 88 that retain the noise voltages and the vertical signal lines 84, 87 and 90 that retain the signal-noise sum voltages is performed as shown below.

A horizontal signal line selection pulse so21 is applied from the horizontal shift register 5 to the horizontal signal line selection switches SA2 and SB4. As a consequence, the vertical signal line 82 is electrically connected to the horizontal signal line 9A, and the vertical signal line 84 is electrically connected to the horizontal signal line 9B. Thus, the noise voltage of the pixel P21 is read via the horizontal signal line 9A, and the signal-noise sum voltage of the pixel P21 is read via the horizontal signal line 9B.

Similarly, a horizontal signal line selection pulse so22 is applied from the horizontal shift register 5 to the horizontal signal line selection switches SA5 and SB7. As a consequence, the vertical signal line 85 is electrically connected to the horizontal signal line 9A, and the vertical signal line 87 is electrically connected to the horizontal signal line 9B. Thus, the noise voltage of the pixel P22 is read via the horizontal signal line 9A, and the signal-noise sum voltage of the pixel P22 is read via the horizontal signal line 9B.

Similarly, a horizontal signal line selection pulse so23 is applied from the horizontal shift register 5 to the horizontal signal line selection switches SA8 and SB0. As a consequence, the vertical signal line 88 is electrically connected to the horizontal signal line 9A, and the vertical signal line 90 is electrically connected to the horizontal signal line 9B. Thus, the noise voltage of the pixel P23 is read via the horizontal signal line 9A, and the signal-noise sum voltage of the pixel P23 is read via the horizontal signal line 9B.

Next, a VR3 voltage is applied from the timing generator 7, and the constant current source connection switches Si3, Si6 and Si9 of output target columns are turned on, so that pixels P31, P32 and P33 are selected from the respective pixels P that belong to the output target rows. Next, upon application of an FD reset pulse φR3 from the vertical shift register 4 to the respective pixels P that belong to the output target rows, the potentials of the FDs 23 are reset and the amplification transistors 24 of the selected pixels P31, P32 and P33 are asserted. Then, source potentials of the amplification transistors 24 of the selected pixels P31, P32 and P33 are respectively outputted to the vertical signal line capacitances 84, 87 and 90, and upon application of a vertical signal line selection pulse sc3 from the vertical signal line selection circuit 10, the vertical signal line selection switches S34, S67 and S90 are turned on. As a consequence, among the respective pixels P that belong to the output target rows, the pixel P31 is electrically connected to the vertical signal line 83, the pixel P32 is electrically connected to the vertical signal line 86, and the pixel P33 is electrically connected to the vertical signal line 89, so that the noise voltages generated at the time of resetting the FDs 23 and the like are outputted to the vertical signal lines 83, 86 and 89 and are retained therein.

Next, a charge transfer pulse φT is applied to the row selected by the vertical shift register 4, by which signal charges accumulated in the PDs 21 are transferred to the FDs 23. Then, upon application of a vertical signal line selection pulse sc1 from the vertical signal line selection circuit 10, the vertical signal line selection switches S45, S78 and S01 are turned on. As a consequence, among the respective pixels P that belong to the output target rows, the pixel P31 is electrically connected to the vertical signal line 85, the pixel P32 is electrically connected to the vertical signal line 88, and the pixel P33 is electrically connected to the vertical signal line 91. The signal-noise sum voltages in the FDs 23 of the pixels P31, P32 and P33 in the first row are outputted to the vertical signal lines 85, 88 and 91, which are in a floating potential state, via the amplification transistors 24, and are retained therein.

Then, the operation to read the noise voltage and the signal-noise sum voltage from each of the vertical signal lines 83, 86 and 89 that retain the noise voltages and the vertical signal lines 85, 88 and 91 that retain the signal-noise sum voltages is performed as shown below.

A horizontal signal line selection pulse so31 is applied from the horizontal shift register 5 to the horizontal signal line selection switches SA3 and SB5. As a consequence, the vertical signal line 83 is electrically connected to the horizontal signal line 9A, and the vertical signal line 85 is electrically connected to the horizontal signal line 9B. Thus, the noise voltage of the pixel P31 is read via the horizontal signal line 9A, and the signal-noise sum voltage of the pixel P31 is read via the horizontal signal line 9B.

Similarly, a horizontal signal line selection pulse so32 is applied from the horizontal shift register 5 to the horizontal signal line selection switches SA6 and SB8. As a consequence, the vertical signal line 86 is electrically connected to the horizontal signal line 9A, and the vertical signal line 88 is electrically connected to the horizontal signal line 9B. Thus, the noise voltage of the pixel P32 is read via the horizontal signal line 9A, and the signal-noise sum voltage of the pixel P32 is read via the horizontal signal line 9B.

Similarly, a horizontal signal line selection pulse so33 is applied from the horizontal shift register 5 to the horizontal signal line selection switches SA9 and SB0. As a consequence, the vertical signal line 89 is electrically connected to the horizontal signal line 9A, and the vertical signal line 90 is electrically connected to the horizontal signal line 9B. Thus, the noise voltage of the pixel P33 is read via the horizontal signal line 9A, and the signal-noise sum voltage of the pixel P33 is read via the horizontal signal line 9B.

In this way, the noise voltage and the signal-noise sum voltage are outputted and read from every third pixels in all the pixels P that belong to the output target rows. In the end, the noise voltages and the signal-noise sum voltages of all the pixels P that belong to the output target rows are outputted and read out.

As described in the foregoing, according to the present embodiment, a noise voltage generated by resetting the output terminal of the PD of a pixel P that is one unit pixel is outputted to another vertical signal line, which is connected via a vertical signal line selection switch to the vertical signal line that is connected to the pixel P, when the vertical signal line selection switch is electrically connected. In contrast, a signal-noise sum voltage outputted from the pixel P is outputted to a vertical signal line, which is connected via another vertical signal line selection switch to the vertical signal line that is connected to the pixel P and which is different from the vertical signal line to which the noise voltage is outputted, when the other vertical signal line selection switch is electrically connected.

More specifically, a signal voltage can easily be acquired by subtracting a noise voltage, which is outputted to one vertical signal line, from a signal-noise sum voltage outputted to the other vertical signal line. In this case, only one capacitative component is required for each vertical signal line. Therefore, as shown in the present embodiment, it becomes possible to implement a configuration in which the noise voltage or the signal-noise sum voltage are retained in the parasitic capacitance of each vertical signal line so that additional provision of capacitative components is avoided. In addition, the signal voltage can easily be acquired simply by providing one capacitative element to each vertical signal line.

As a result, it becomes possible to acquire a signal with high noise resistance by subtracting the noise voltage from the signal-noise sum voltage, as well as to reduce the number of capacitative elements on a chip to decrease a surface ratio of a peripheral circuit section including a capacitative element section to a pixel array section.

Note that in FIG. 4, reference characters C11 to C33 schematically designate capacitative components provided in each of the vertical signal lines.

Further, in the solid-state imaging device according to the present embodiment, the noise voltage or the signal-noise sum voltage outputted to one vertical signal line is respectively outputted to other adjacent vertical signal lines positioned at an equal distance on both sides of the vertical signal line. This makes it possible to generally equalize the lengths of respective lines that retain voltages. Therefore, in the case of using the lines as capacitative components, the capacitance of the lines that retain voltages can be equalized, so that precision can advantageously be enhanced.

Third Embodiment

Hereinafter, a solid-state imaging device according to a third embodiment of the present invention is described with reference to the drawings.

In the present embodiment, component members identical to those in the above-stated first embodiment are designated by the identical reference numerals to omit the description thereof.

Figure 6:
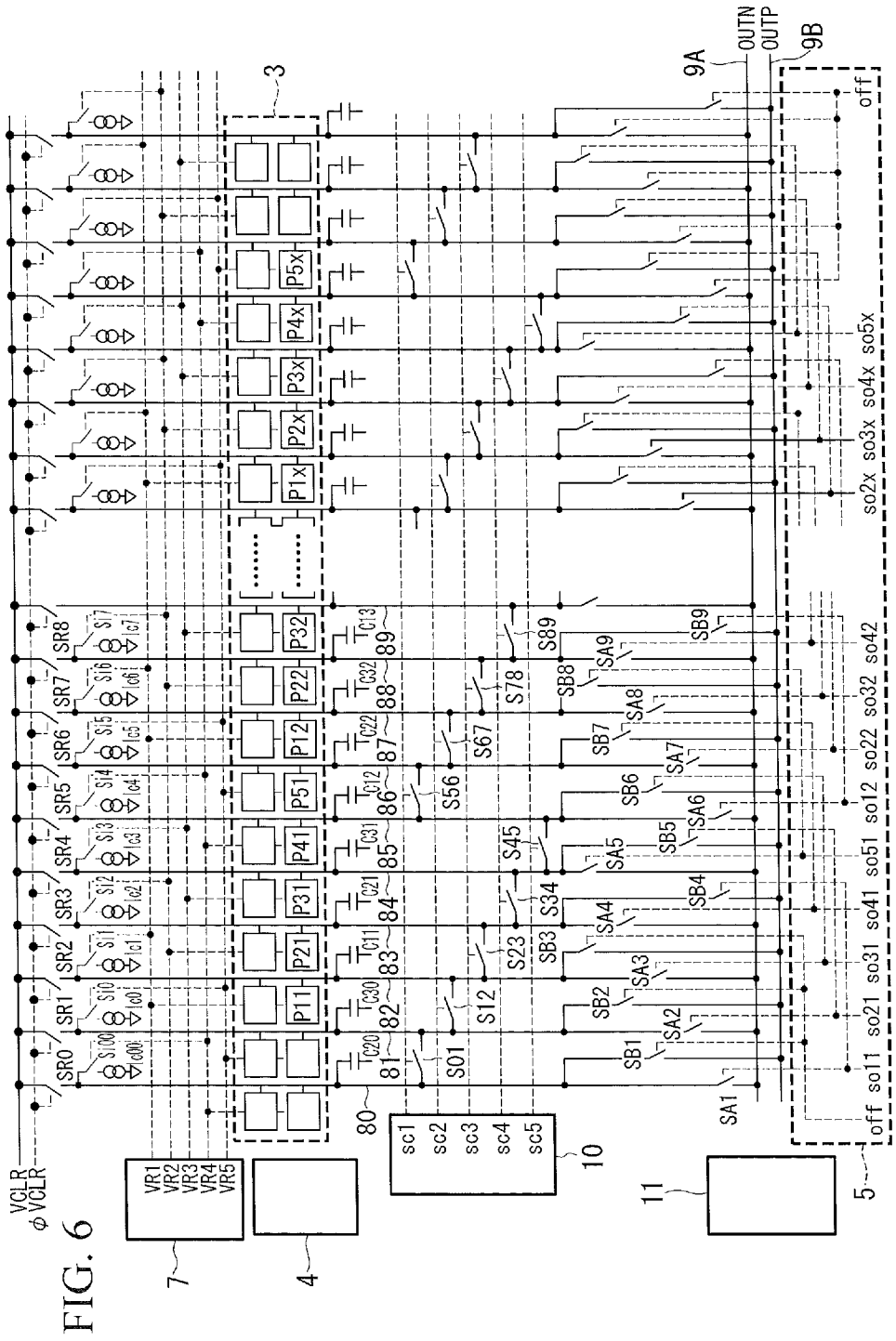
FIG. 6 is a circuit view showing configuration of a solid-state imaging device according to a third embodiment of the present invention.

As shown in FIG. 6, among a plurality of pixels P arrayed in a matrix formed on the pixel array 3, the pixels P belonging to the same column are each connected to common vertical signal lines 80, 81, 82, 83, 84, 85, 86, 87 . . . . Here, the present embodiment is different from the aforementioned first and second embodiments in that the noise voltage and the signal-noise sum voltage are outputted and read from every fifth pixel in all the pixels P that belong to an output target rows. Accordingly, a description is hereinbelow given of procedures to output and read the noise voltage and the signal-noise sum voltage from the pixels P11 to P51 among all the pixels P that belong to the output target rows. As for other pixels that belong to the output target rows, their noise voltages and signal-noise sum voltages are outputted and read out according to the same procedures, and therefore the description thereof is omitted.

The respective vertical signal lines 80, 81, 82, 83, 84, 85, 86, 87 and 88 are each provided with vertical signal line selection switches S01 to S78 adapted to switch electrical connection and disconnection with adjacent vertical signal lines on both sides.

Further, the respective vertical signal lines 80, 81, 82, 83, 84, 85, 86, 87 and 88 are connected to horizontal signal lines 9A and 9B via horizontal signal line selection switches SA1 to SB7.

Figure 7:
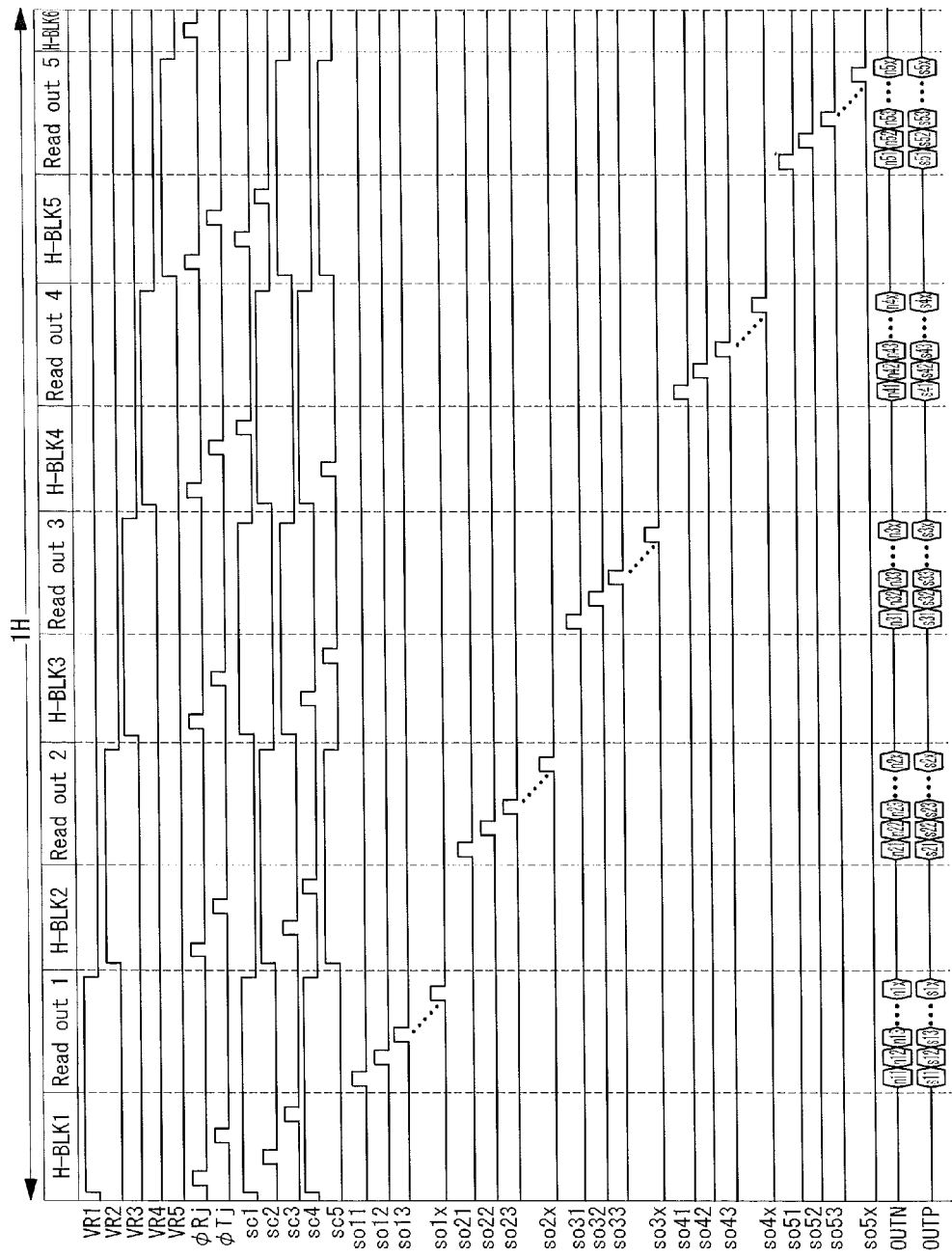
FIG. 7 is a timing chart showing operation of the solid-state imaging device of FIG. 6.

A method for driving the thus-configured solid-state imaging device is described with reference to the timing chart of FIG. 7. The present embodiment is different from the aforementioned first and second embodiments in that the noise voltage and the signal-noise sum voltage are outputted and read from every fifth pixel in all the pixels P that belong to an output target row.

The operation to output the noise voltage and the signal-noise sum voltage to vertical signal lines and to temporarily retain the charges thereof in the parasitic capacitances of the vertical signal lines in the solid-state imaging device according to the present embodiment is performed as shown below.

In the initial state, a vertical signal line reset pulse φVCLR is applied, and the potentials of FDs 23 and the vertical signal lines 80, 81, 82, 83, 84, 85, 86, 87 and 88 are reset to a VCLR potential.

In this state, a VR1 voltage is applied from the timing generator 7, and a constant current source connection switch Si1 of an output target column is turned on, so that a pixel P11 is selected from the respective pixels P that belong to the output target row. Next, upon application of an FD reset pulse φR1 from the vertical shift register 4 to the respective pixels P that belong to the output target row, the potentials of the FDs 23 are reset and the amplification transistor 24 of the selected pixel P11 is asserted. Then, a source potential of the amplification transistor 24 in the selected pixel P11 is outputted to vertical signal line capacitances 82 and 87, and upon application of vertical signal line selection pulses sc1 and sc4 from the vertical signal line selection circuit 10, the vertical signal line selection switches S01 and S34 are turned on. Further, upon application of a vertical signal line selection pulse sc2 from the vertical signal line selection circuit 10, the vertical signal line selection switch S12 is turned on. As a consequence, among the respective pixels P that belong to the output target row, the pixel P11 is electrically connected to the vertical signal lines 80 and 81, so that a noise voltage generated at the time of resetting the FD 23 and the like is outputted to the vertical signal lines 80 and 81, and is retained therein. After that, the vertical signal line selection switch S12 is turned off.

Next, a charge transfer pulse φT is applied to the row selected by the vertical shift register 4, by which signal charges accumulated in the PDs 21 are transferred to the FDs 23. Then, in the state where the vertical signal line selection pulses sc1 and sc4 are applied, a vertical signal line selection pulse sc3 is applied from the vertical signal line selection circuit 10, so that the vertical signal line selection switch S23 is turned on. As a consequence, among the respective pixels P that belong to the output target row, the pixel P11 is electrically connected to the vertical signal lines 83 and 84. The signal-noise sum voltage in the FD 23 of the pixel P11 is outputted to the vertical signal lines 83 and 84, which are in a floating potential state, via the amplification transistor 24, and are retained therein.

Then, the operation to read the noise voltage and the signal-noise sum voltage from each of the vertical signal lines 80 and 81 that retain the noise voltage and the vertical signal lines 83 and 84 that retain the signal-noise sum voltage is performed as shown below.

In the state where the vertical signal line selection pulses sc1 and sc4 are applied, a horizontal signal line selection pulse so11 is applied from the horizontal shift register 5 to the horizontal signal line selection switches SA0 and SB3. As a consequence, the vertical signal lines 80 and 81 are electrically connected to the horizontal signal line 9A, and the vertical signal lines 83 and 84 are electrically connected to the horizontal signal line 9B. Then, the noise voltage of the pixel P11 is read via the horizontal signal line 9A, and the signal-noise sum voltage of the pixel P11 is read via the horizontal signal line 9B.

When a VR2 voltage is applied from the timing generator 7, and a constant current source connection switch Sit of an output target column is turned on, a pixel P21 is selected from the respective pixels P that belong to the output target row. Next, upon application of an FD reset pulse φR2 from the vertical shift register 4 to the respective pixels P that belong to the output target row, the potentials of the FDs 23 are reset and the amplification transistor 24 of the selected pixel P21 is asserted.

Then, a source potential of the amplification transistor 24 in the selected pixel P21 is outputted to vertical signal line capacitances 83 and 88, and upon application of vertical signal line selection pulses sc2 and sc5 from the vertical signal line selection circuit 10, the vertical signal line selection switches S12 and S45 are turned on. Furthermore, upon application of a vertical signal line selection pulse sc3 from the vertical signal line selection circuit 10, the vertical signal line selection switch S23 is turned on. As a consequence, among the respective pixels P that belong to the output target row, the pixel P21 is electrically connected to the vertical signal lines 81 and 82, so that a noise voltage generated at the time of resetting the FD 23 and the like is outputted to the vertical signal lines 81 and 82, and is retained therein. After that, the vertical signal line selection switch S23 is turned off.

Next, a charge transfer pulse φT is applied to the row selected by the vertical shift register 4, by which signal charges accumulated in the PDs 21 are transferred to the FDs 23. Then, in the state where the vertical signal line selection pulses sc2 and sc5 are applied, a vertical signal line selection pulse sc4 is applied from the vertical signal line selection circuit 10, so that the vertical signal line selection switch S34 is turned on. As a consequence, among the respective pixels P that belong to the output target row, the pixel P21 is electrically connected to the vertical signal lines 84 and 85. The signal-noise sum voltage in the FD 23 of the pixel P21 is outputted to the vertical signal lines 84 and 85, which are in a floating potential state, via the amplification transistor 24, and are retained therein.

Then, the operation to read the noise voltage and the signal-noise sum voltage from each of the vertical signal lines 81 and 82 that retain the noise voltage and the vertical signal lines 84 and 85 that retain the signal-noise sum voltage is performed as shown below.

In the state where the vertical signal line selection pulses sc2 and sc5 are applied, a horizontal signal line selection pulse so21 is applied from the horizontal shift register 5 to the horizontal signal line selection switches SA1 and SB4. As a consequence, the vertical signal lines 81 and 82 are electrically connected to the horizontal signal line 9A, and the vertical signal lines 84 and 85 are electrically connected to the horizontal signal line 9B. Thus, the noise voltage of the pixel P21 is read via the horizontal signal line 9A, and the signal-noise sum voltage of the pixel P21 is read via the horizontal signal line 9B.

Next, when a VR3 voltage is applied from the timing generator 7, and a constant current source connection switch Si3 of an output target column is turned on, a pixel P31 is selected from the respective pixels P that belong to the output target row. Next, upon application of an FD reset pulse φR3 from the vertical shift register 4 to the respective pixels P that belong to the output target row, the potential of the FD 23 is reset and the amplification transistor 24 of the selected pixel P31 is asserted.

Then, a source potential of the amplification transistor 24 in the selected pixel P31 is outputted to vertical signal line capacitances 84 and 89, and upon application of vertical signal line selection pulses sc3 and sc1 from the vertical signal line selection circuit 10, the vertical signal line selection switches S23 and S56 are turned on. Furthermore, upon application of a vertical signal line selection pulse sc4 from the vertical signal line selection circuit 10, the vertical signal line selection switch S34 is turned on. As a consequence, among the respective pixels P that belong to the output target row, the pixel P31 is electrically connected to the vertical signal lines 82 and 83, so that a noise voltage generated at the time of resetting the FD 23 and the like is outputted to the vertical signal lines 82 and 83, and is retained therein. After that, the vertical signal line selection switch S34 is turned off.

Next, a charge transfer pulse φT is applied to the row selected by the vertical shift register 4, by which signal charges accumulated in the PDs 21 are transferred to the FDs 23. Then, in the state where the vertical signal line selection pulses sc3 and sc1 are applied, a vertical signal line selection pulse sc5 is applied from the vertical signal line selection circuit 10, so that the vertical signal line selection switch S45 is turned on. As a consequence, among the respective pixels P that belong to the output target row, the pixel P31 is electrically connected to the vertical signal lines 85 and 86. The signal-noise sum voltage in the FD 23 of the pixel P31 is outputted to the vertical signal lines 85 and 86, which are in a floating potential state, via the amplification transistor 24, and are retained therein.

Then, the operation to read the noise voltage and the signal-noise sum voltage from each of the vertical signal lines 82 and 83 that retain the noise voltage and the vertical signal lines 85 and 86 that retain the signal-noise sum voltage is performed as shown below.

In the state where the vertical signal line selection pulses sc3 and sc1 are applied, a horizontal signal line selection pulse so31 is applied from the horizontal shift register 5 to the horizontal signal line selection switches SA2 and SB5. As a consequence, the vertical signal lines 82 and 83 are electrically connected to the horizontal signal line 9A, and the vertical signal lines 85 and 86 are electrically connected to the horizontal signal line 9B. Thus, the noise voltage of the pixel P31 is read via the horizontal signal line 9A, and the signal-noise sum voltage of the pixel P31 is read via the horizontal signal line 9B.

Next, when a VR4 voltage is applied from the timing generator 7, and a constant current source connection switch Si4 of an output target column is turned on, a pixel P41 is selected from the respective pixels P that belong to the output target row. Next, upon application of an FD reset pulse φR3 from the vertical shift register 4 to the respective pixels P that belong to the output target row, the potentials of the FDs 23 are reset and the amplification transistor 24 of the selected pixel P41 is asserted.

Then, a source potential of the amplification transistor 24 in the selected pixel P41 is outputted to each of the vertical signal line capacitance 85, and upon application of vertical signal line selection pulses sc4 and sc2 from the vertical signal line selection circuit 10, the vertical signal line selection switches S34 and S67 are turned on. Furthermore, a vertical signal line selection pulse sc5 is applied from the vertical signal line selection circuit 10, and the vertical signal line selection switch S45 is turned on. As a consequence, among the respective pixels P that belong to the output target row, the pixel P41 is electrically connected to the vertical signal lines 83 and 84, so that a noise voltage generated at the time of resetting the FD 23 and the like is outputted to the vertical signal lines 83 and 84, and is retained therein. After that, the vertical signal line selection switch S45 is turned off.

Next, a charge transfer pulse φT is applied to the row selected by the vertical shift register 4, by which signal charges accumulated in the PDs 21 are transferred to the FDs 23. Then, in the state where the vertical signal line selection pulses sc4 and sc2 are applied, a vertical signal line selection pulse sc1 is applied from the vertical signal line selection circuit 10, so that the vertical signal line selection switch S56 is turned on. As a consequence, among the respective pixels P that belong to the output target row, the pixel P31 is electrically connected to the vertical signal lines 86 and 87. The signal-noise sum voltage in the FD 23 of the pixel P41 is outputted to the vertical signal lines 84 and 85, which are in a floating potential state, via the amplification transistor 24, and are retained therein.

Then, the operation to read the noise voltage and the signal-noise sum voltage from each of the vertical signal lines 83 and 84 that retain the noise voltage and the vertical signal lines 86 and 87 that retain the signal-noise sum voltage is performed as shown below.

In the state where the vertical signal line selection pulses sc4 and sc2 are applied, a horizontal signal line selection pulse so41 is applied from the horizontal shift register 5 to the horizontal signal line selection switches SA3 and SB6. As a consequence, the vertical signal lines 83 and 84 are electrically connected to the horizontal signal line 9A, and the vertical signal lines 86 and 87 are electrically connected to the horizontal signal line 9B. Thus, the noise voltage of the pixel P41 is read via the horizontal signal line 9A, and the signal-noise sum voltage of the pixel P41 is read via the horizontal signal line 9B.

Next, when a VR5 voltage is applied from the timing generator 7, and a constant current source connection switch Si5 of an output target column is turned on, a pixel P51 is selected from the respective pixels P that belong to the output target row. Next, upon application of an FD reset pulse φR3 from the vertical shift register 4 to the respective pixels P that belong to the output target row, the potential of the FD 23 is reset and the amplification transistor 24 of the selected pixel P51 is asserted.

Then, a source potential of the amplification transistor 24 in the selected pixel P51 is outputted to each of the vertical signal line capacitance 86, and upon application of vertical signal line selection pulses sc5 and sc3 from the vertical signal line selection circuit 10, the vertical signal line selection switches S45 and S78 are turned on. Furthermore, upon application of a vertical signal line selection pulse sc1 from the vertical signal line selection circuit 10, the vertical signal line selection switch S56 is turned on. As a consequence, among the respective pixels P that belong to the output target row, the pixel P51 is electrically connected to the vertical signal lines 84 and 85, so that a noise voltage generated at the time of resetting the FD 23 and the like is outputted to the vertical signal lines 84 and 85, and is retained therein. After that, the vertical signal line selection switch S56 is turned off.

Next, a charge transfer pulse φT is applied to the row selected by the vertical shift register 4, by which signal charges accumulated in the PDs 21 are transferred to the FDs 23. Then, in the state where the vertical signal line selection pulses sc5 and sc3 are applied, a vertical signal line selection pulse sc2 is applied from the vertical signal line selection circuit 10, so that the vertical signal line selection switch S67 is turned on. As a consequence, among the respective pixels P that belong to the output target row, the pixel P51 is electrically connected to the vertical signal lines 87 and 88. The signal-noise sum voltage in the FD 23 of the pixel P51 is outputted to the vertical signal lines 87 and 88, which are in a floating potential state, via the amplification transistor 24, and are retained therein.

Then, the operation to read the noise voltage and the signal-noise sum voltage from each of the vertical signal lines 84 and 85 that retain the noise voltage and the vertical signal lines 87 and 88 that retain the signal-noise sum voltage is performed as shown below.

In the state where the vertical signal line selection pulses sc5 and sc3 are applied, a horizontal signal line selection pulse so51 is applied from the horizontal shift register 5 to the horizontal signal line selection switches SA4 and SB7. As a consequence, the vertical signal lines 84 and 85 are electrically connected to the horizontal signal line 9A, and the vertical signal lines 87 and 88 are electrically connected to the horizontal signal line 9B. Thus, the noise voltage of the pixel P51 is read via the horizontal signal line 9A, and the signal-noise sum voltage of the pixel P51 is read via the horizontal signal line 9B.

As described in the foregoing, according to the present embodiment, a noise voltage generated by resetting the output terminal of the PD of a pixel P that is one unit pixel is outputted to other two vertical signal lines, which are connected via vertical signal line selection switches to the vertical signal line that is connected to the pixel P, when the vertical signal line selection switches are electrically connected. In contrast, a signal-noise sum voltage outputted from the pixel P is outputted to two vertical signal lines, which are connected via other vertical signal line selection switches to the vertical signal line that is connected to the pixel P and which are different from the vertical signal lines to which the noise voltage is outputted, when the other vertical signal line selection switches are electrically connected.

With such a configuration, even in the case of using the parasitic capacitance of the vertical signal line as a capacitive component, sufficient capacitance can be secured and a large signal voltage can be supported.

In the present embodiment, although the noise voltage and the signal-noise sum voltage are respectively outputted to two vertical signal lines which are connected in parallel with each other, the voltages may be outputted to three or more vertical signal lines instead.

REFERENCE SIGNS LIST

3 Pixel array
4 Vertical shift register
5 Horizontal shift register
7 Timing generator
81, 82, 83, 84, 85, 86, 87, 88, 89 Vertical signal line
9A, 9B Horizontal signal line
10 Vertical signal line selection circuit
11 Control circuit
SA1 to SB9 Horizontal signal line selection switch
S12 to S89 Vertical signal line selection switch
SR1 to SR9 Vertical signal line reset switch
Ic1 to Ic9 Constant current source
Si1 to Si9 Constant current source connection switch

The invention claimed is:

1. A solid-state imaging device, comprising:
a plurality of unit pixels arrayed in two dimensions;
a plurality of transfer lines to each of which a different pixel group of one or more unit pixels are commonly connected; and
a plurality of switches adapted to switch electric connection and disconnection between each of the transfer lines and other two or more transfer lines, wherein
each of the unit pixels includes a photoelectric conversion element adapted to photoelectrically convert incident light and a charge voltage conversion element adapted to convert the photoelectrically converted charge into a voltage, and outputs respectively a noise voltage generated when the charge voltage conversion element is reset and a signal-noise sum voltage obtained by adding to the noise voltage a signal charge generated by the photoelectric conversion to the other transfer lines that are connected via the switches to the transfer line to which the pixel group including the unit pixel belongs.

2. The solid-state imaging device according to claim 1, wherein
each of the switches is provided on a line that connect each of the transfer lines and each of a plurality of other transfer lines placed at equal distance from the transfer line.

3. The solid-state imaging device according to claim 1, wherein
each of the switches is provided so as to output respectively the noise voltage and the signal-noise sum voltage outputted from each of the unit pixels to the plurality of other transfer lines.

4. The solid-state imaging device according to any one of claim 1, comprising
a control unit adapted to execute, for each group including three or more of the transfer lines connected via the switches,
operation to output the noise voltage from alternatively selected one of the unit pixels and to retain the noise voltage in a first other transfer line connected via the switches,
operation to output the signal-noise sum voltage from the selected unit pixel and to retain the signal-noise sum voltage in a second other transfer line connected via the switches,
operation to read the noise voltage retained in the first other transfer line, and
operation to read the signal-noise sum voltage retained in the second other transfer line.

5. The solid-state imaging device according to claim 4, comprising
a supply voltage switching means adapted to switch a potential of supply voltage connected to the unit pixels between an enable potential which enables voltage output from the unit pixels and a disable potential which stops voltage output from the unit pixels, wherein
the control unit controls the supply voltage switching means so as to supply as a supply voltage the enable potential to selected one of the unit pixels and supply as a supply voltage the disable potential to other unit pixels in the same group when the noise voltage and the signal-noise sum voltage are outputted from the selected unit pixel.

6. The solid-state imaging device according to claim 1, comprising:
a first transfer line connected to a pixel group belonging to a first column of the plurality of unit pixels arrayed in two dimensions;
a second transfer line connected to a pixel group belonging to a second column of the plurality of unit pixels arrayed in two dimensions;
a third transfer line connected to a pixel group belonging to a third column of the plurality of unit pixels arrayed in two dimensions;
a first switch adapted to switch electric connection and disconnection between the first transfer line and the second transfer line;
a second switch adapted to switch electric connection and disconnection between the second transfer line and the third transfer line;
a third switch adapted to switch electric connection and disconnection between the first transfer line and the third transfer line; and
a control unit adapted to
close the first switch and the third switch so as to output the noise voltage and the signal-noise sum voltage from the unit pixels belonging to the first transfer line respectively to the second transfer line and the third transfer line,
close the second switch and the first switch so as to output the noise voltage and the signal-noise sum voltage from the unit pixels belonging to the second transfer line respectively to the third transfer line and the first transfer line, and
close the third switch and the second switch so as to output the noise voltage and the signal-noise sum voltage from the unit pixels belonging to the third transfer line respectively to the first transfer line and the second transfer line.

* * * * *